United States Patent [19]

Frisbie et al.

[11] 3,731,867

[45] May 8, 1973

[54] VACUUM DIE SENSOR APPARATUS AND METHOD FOR A SEMICONDUCTOR DIE BONDING MACHINE

[75] Inventors: Milo W. Frisbie; Frank E. Polka; Philip Vaught, all of Phoenix, Ariz.

[73] Assignee: Motorola, Inc., Franklin Park, Ill.

[22] Filed: July 19, 1971

[21] Appl. No.: 163,920

[52] U.S. Cl. ....................228/6, 29/203 P, 29/203 V, 29/624, 228/10

[51] Int. Cl. ..............................................B23k 1/00

[58] Field of Search...........................228/6, 6.5, 8, 9, 228/10; 29/203 B, 203 P, 203 V, 592, 624; 214/1 BT; 294/64

[56] References Cited

UNITED STATES PATENTS

| | | | |
|---|---|---|---|
| 3,657,790 | 4/1972 | Larrison | 228/8 |
| 3,628,717 | 12/1971 | Lynch et al. | 228/6 |
| 3,499,204 | 3/1970 | Drop | 29/203 B |
| 3,479,716 | 11/1969 | Zanger, Jr. et al. | 294/64 R |
| 3,453,714 | 7/1969 | Clark et al. | 29/203 V |
| 3,442,432 | 5/1969 | Santangini | 228/44 |
| 3,271,555 | 9/1966 | Hirshan et al. | 29/203 V |

*Primary Examiner*—J. Spencer Overholser
*Assistant Examiner*—Robert J. Craig
*Attorney*—Mueller & Aichele

[57] ABSTRACT

Sensing apparatus for determining whether or not a vacuum pickup mechanism for picking up a semiconductor die and transferring it to a lead to which it is to be bonded has picked up a die is disclosed wherein a photo cell is continuously illuminated by a beam of light except when the beam of light is blocked by a cylindrical plunger relatively easily movable in a glass tube. When no die has been picked up, and vacuum is applied at the sensing point the plunger moves up to block the light beam. Under this influence the indexing motor for moving the lead upon which the die is to be mounted is prevented from starting, and the lead frame remains stationary until a die is deposited. When a die has been picked up, the sensing vacuum is applied but is ineffective because the plunger remains down, after an upward transient, and through appropriate circuitry the indexing motor moves the lead frame along in the normal manner.

9 Claims, 8 Drawing Figures

INVENTOR
Frank E. Polka
BY Philip Vaught
Milo W. Frisbie
Mueller & Aichele
ATTY'S.

INVENTOR.
BY Frank E. Polka
Philip Vaught
Milo W. Frisbie
Mueller & Aichele
ATTY'S.

INVENTOR
Frank E. Polka
Philip Vaught
Milo W. Frisbie
BY
Mueller & Aichele
ATTY'S INVENTOR.
Frank E. Polka
Philip Vaught
Milo W. Frisbie
BY
Mueller & Aichele
ATTY'S.

VACUUM DIE SENSOR APPARATUS AND METHOD FOR A SEMICONDUCTOR DIE BONDING MACHINE

BACKGROUND OF THE INVENTION

This invention relates to sensing apparatus and methods for determining whether, or not, a semiconductor chip vacuum pick-up device has picked up a chip from a source of chips, and if it has not, to prevent the indexing of a lead frame, or the like, until a semiconductor chip has been picked up and deposited upon the appropriate place on the lead frame and it is an object of the invention to provide improved apparatus and methods of this nature. More particularly, the invention relates to sensing apparatus and methods of the nature indicated which are accurate and fast in order that die-bonding machines in which such sensing methods and apparatus are used may operate at high speeds without, or at least minimum, error, whereby such apparatus and methods operate efficiently and economically.

The making of semiconductor devices such as diodes, transistors, and combinations of these items has become a highly automated procedure. The problem of picking up a die from one source such, for example, as a wafer which has previously been formed into a source of a large number of dice is complicated by the fact that the dice are of very small dimensions and the lead members on a lead frame, or the like, are likewise of small dimensions. The foregoing requires the picking up of small pieces and placing them upon small areas which is a very refined operation. If a die is not picked up from the source by the pick-up probe which may be vacuum operated and the indexing means for driving the lead frame is permitted to continue to move, i.e. index, a faulty structure and a rejected device will result. Efficiency is therefore reduced, economies are reduced and the resultant cost is increased.

Sensing apparatus is known to the prior art in which a vacuum pick-up for a semiconductor chip is used. Such sensing means have been inefficient and have not resulted in the increased economies of operation which the present invention makes possible.

Accordingly, it is a further object of the invention to provide improved apparatus and methods of the character indicated which obviate the disadvantages of the prior art.

It is a further object of the invention to provide improved apparatus and methods of the nature indicated wherein the reject rate is substantially reduced over known apparatus and methods.

It is a further object of the invention to provide improved apparatus and methods of the character indicated which reduces the reject rate by several percent. In high speed die bonders, in a competitive industry such an improvement in reduction of the reject rate is most worthwhile.

SUMMARY OF THE INVENTION

In carrying out the invention in one form, there is provided in a semiconductor die-bonding apparatus wherein: a die is picked up from a wafer of dice by a vacuum-energized probe, and transferred to a position adjacent a lead member to which the die is to be bonded and at which point it is intended that the die be deposited for bonding and the vacuum released, and indexing start means are provided for energizing an indexing motor to move the lead member containing the deposited and bonded dice to a subsequent position; means for preventing the indexing of said start means comprising means for sensing the presence of a dice on said probe; and photoelectric means responsive to the die presence condition on said probe for controlling the energization of said indexing start means.

In carrying out the invention in another form, there is provided in a semiconductor die-bonding apparatus wherein: a die is picked up from a wafer of dice, by a vacuum energized probe, and transferred to a position adjacent a lead member to which the die is to be bonded, and at which point it is intended that the die be deposited for bonding and the vacuum released, and indexing start means are provided for energizing an indexing motor to move a lead member containing the deposited and bonded dice to a subsequent position, means for preventing the indexing of said start means said start means comprising a vacuum line adapted to be connected to said probe at one end and to a vacuum source at the other end, valve means in said vacuum line for controlling the application of vacuum to and the removal of vacuum from said probe, said valve means comprising a vertically disposed clear tube and an opaque plunger freely movable in said tube, said plunger being adapted to move upwardly under the influence of applied vacuum and being adapted to move downwardly under the influence of gravity when said vacuum is released, means for applying vacuum to said vacuum line when said probe is about to pick up a die and if a die is picked up, said probe end is blocked whereupon said plunger moves to and remains in its downward position, photoelectric means including a light source on one side of said clear tube adjacent the upper end thereof and a light sensitive device on the other side of said clear tube adjacent the upper end thereof and being adapted to receive the light from said light source; means for sensing for the presence of a die at the end of said probe when said probe is in the stage of depositing a die on a lead member comprising a control circuit, switch means adapted be closed in response to the position of said probe for effecting energization of said control circuit, and said control circuit functioning when no die is at said probe and said plunger is at the top of said clear tube blocking the transmission of light to prevent energization of said index start means and functioning when a die is at said probe and said plunger is at the bottom of said clear tube permitting the transmission of light to effect energization of said index start means.

DESCRIPTION OF THE PREFERRED EMBODIMENT

Figures 1, 2:
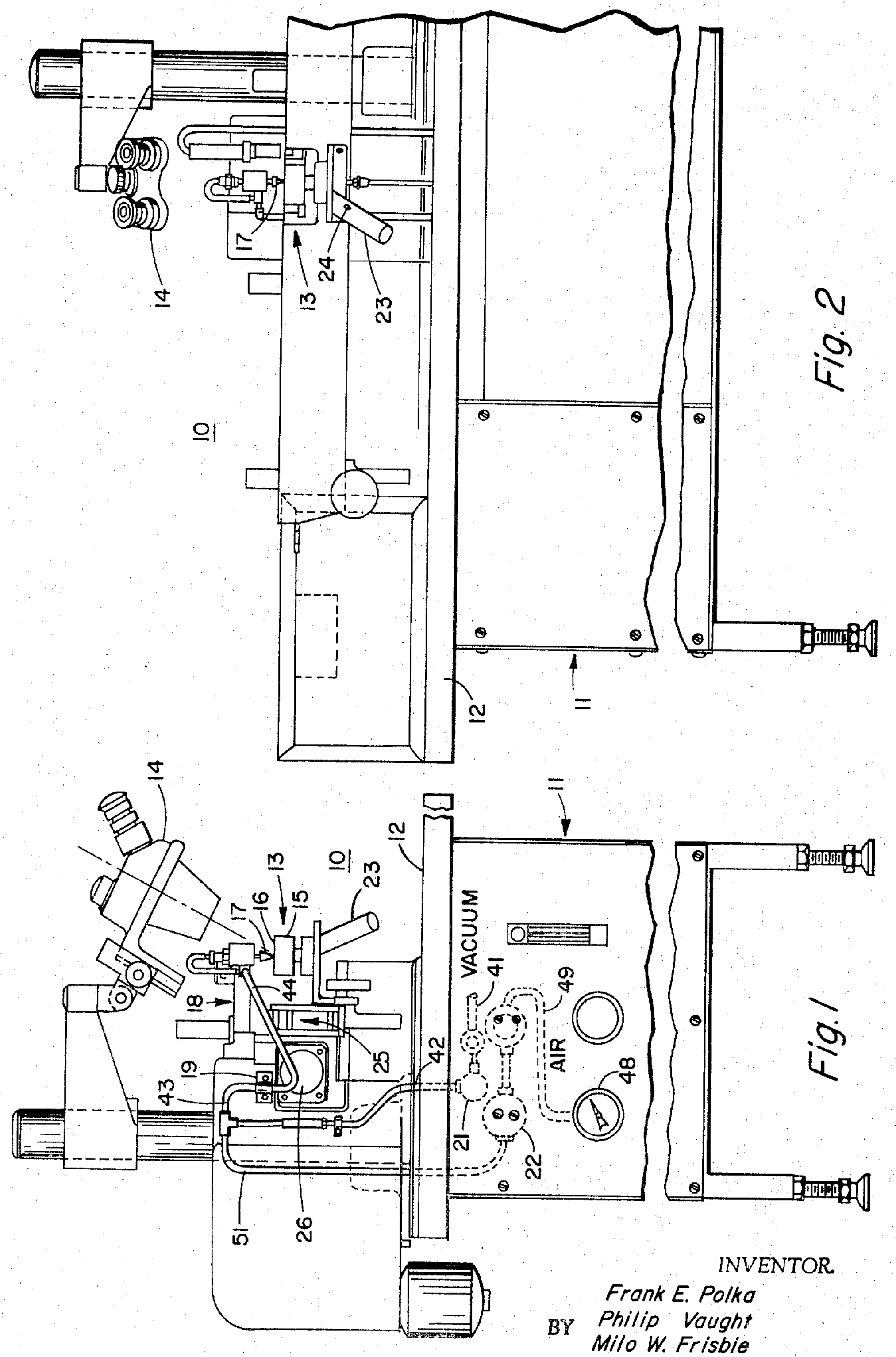
FIG. 1 is an end view of a semiconductor die bonding machine incorporating the sensing apparatus and method according to the invention.
FIG. 2 is a fragmentary front view of the apparatus shown in FIG. 1.

Referring to the drawings the invention is shown embodied in a die-bonding apparatus 10 comprising a table 11, a platform 12 upon which the bonding apparatus 13 is disposed, a scope 14 whereby the operator may view the operation a table 15 upon which a wafer 16 of dice may be disposed, a probe 17 for picking up individual dice from the wafer, mechanism 18 for moving the probe 17 to and fro, a vacuum sensing component 19 for determining when the probe has picked up a die, a vacuum supply mechanism or valve 21, and an air blow-off mechanism or valve 22. A handle 23 is disposed beneath the table 15 and enables the operator of the device to shift the table 15 from one position to another in order that the probe 17 may pick up a die from the wafer 16. A thumb-actuated switch 24, to be more particularly described, is disposed on the handle 23 for enabling the operator to start the cycle of the apparatus. Lead frame carrying and indexing means 25 are disposed rearwardly of the table 15 and an indexing motor 26 is provided for operating the lead frame indexing means as will be described.

The general arrangement of the component parts for the die-bonder is well known to the prior art and, as such, forms no part of the present invention. The present invention relates to sensing means which ultimately control the probe 17 to be certain that it picks up and deposits a die upon an appropriate lead, and if this is not carried out, the lead frame containing the lead does not index. In this manner the number of spoiled circuits is reduced because the probe continues to operate until a die is deposited at the appropriate place upon the lead frame.

Figure 3:
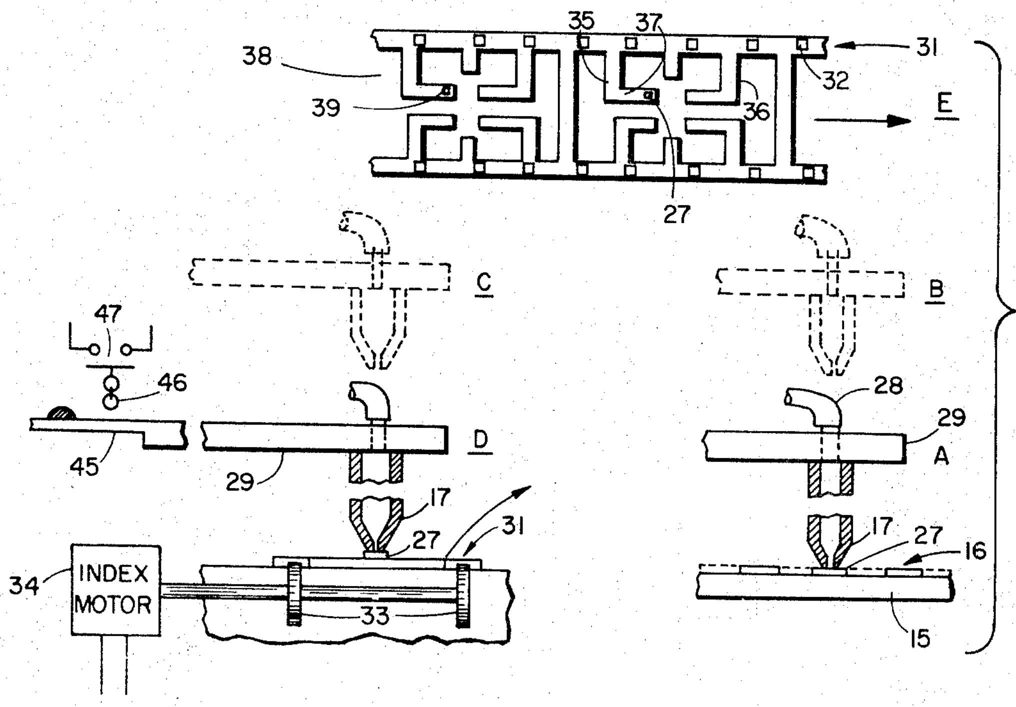
FIG. 3 (A, B, C, D, E) is an exploded view, partially in dotted lines, illustrating certain portions of the apparatus and operation according to the invention.

Reference should now be had to FIG. 3 (A, B, C, D, E) wherein the overall mechanical operation of the apparatus may be visualized. The components, as shown in FIG. 3, are somewhat diagrammatic and include the table 15 upon which the diced wafer 16 is disposed whereby individual dice such, for example, as die 27 may be picked up by the probe 17. The probe 17 is hollow as shown and is connected to a tube, hose 28 or the like through which vacuum is applied to the probe 17, or air is blown therethrough, depending upon the phase of the operation being carried out. In the die pick-up position of the probe 17, it is in its lowermost position A as shown in FIG. 3, the probe being attached to an operating arm 29 forming part of the mechanism 18. After a die is picked up, or is supposed to have been picked up, the arm 29 and the associated probe 17 move upwardly to the position B shown by the dotted lines immediately above the table 15. From the position B, the probe 17 and the associated mechanism move rearwardly to the position C also shown dotted and from the position C, the probe 17 moves downwardly to position D to deposit the dice 27 upon a lead frame 31 (FIG. 3E). The lead frame 31 has the usual side members with perforations 32 for receiving the teeth of toothed wheels 33, for example, driven by the indexing motor 26 to shift the lead frame from one position to the next. The lead frame 31 includes lead members 35 and 36, for example, extending inwardly. At the end of lead member 35 there is a portion 37 designated as a flag at which the die 27 is to be deposited by the probe 17. It is one of the purposes of the subject invention to prevent the movement of the lead frame 31 from one position to the next in the event that the die 27 is not deposited as indicated. Disposed rearwardly of the lead members 35 and 36 is a second group of lead members designated generally by the reference character 38 at the flag 39 of which a second die is deposited during the proper operation of the inventive apparatus.

Figure 7:
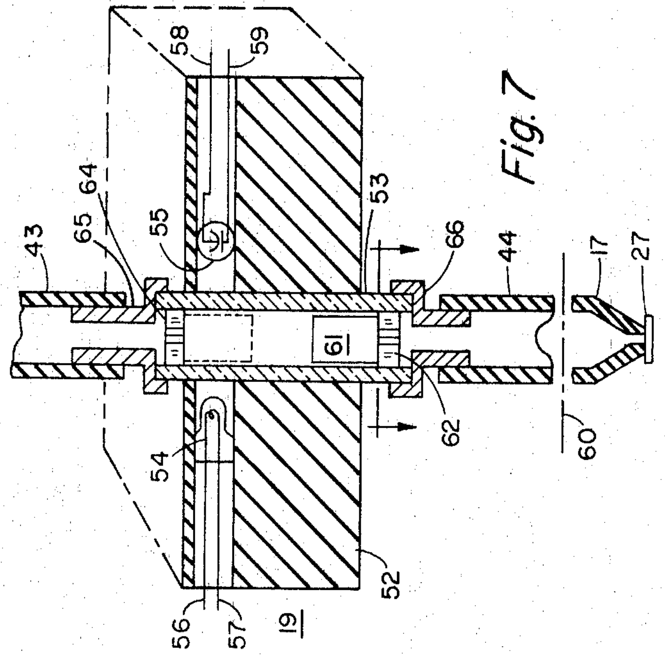
FIG. 7 is a sectional view illustrating certain of the vacuum sensing components of the apparatus according to the invention.

As will be more fully explained in connection with FIG. 4, the sensing of the presence of a die 27 at the end of probe 17 takes place when the probe 17 is in its downward position D, the sensing being carried out by the sensing mechanism 19 (FIG. 7). The condition of sensing mechanism 19 is determined by the vacuum condition, the vacuum if present having been applied through valve mechanism 21 (FIG. 1) from a source of vacuum 41 through pipes or tubes 42, 43 and 44. After each deposition of a die 27, or attempt thereat, and the probe 17 rises to position C and moves forwardly to position B, the end of an arm or finger 45 engages the rolling contact actuating members 46 to close the contacts 47 to actuate the air blowout solenoid operated valve 22 (FIG. 1). Air blows from a source 48 through pipes or tubes 49, 51, 43 and 44 and through the probe 17 to remove any accumulated material such as dust or metal particles from the semiconductor chips. In this manner, the probe, the sensing mechanism, and the associated pipes and tubing are kept clean in order that the vacuum when applied is more effective.

Referring to FIG. 7 the sensing mechanism 19 is shown as comprising a supporting member such, for example, as a synthetic block of material 52 within which there is disposed a clear tube 53 which, for example, may be of accurately formed quartz glass. Other glasses, if stable and accurate, can be used, for example, Pyrex glass. Disposed near the upper surface of the member 52 is a passageway extending all the way therethrough and within one side of which there is a source of light 54. Immediately opposite the source of light 54 is a photocell 55 which, for example, may be a photosensitive transistor. Leads 56 and 57 extend from the light source 54 and leads 58 and 59 extend from the phototube 55 to be connected into the circuit to be described.

Disposed within the clear tube 53 is a metallic cylinder 61, or plunger, which, for example, may be made of stainless steel although other metals may be utilized.

For the plunger 61 to work properly under the applied vacuum, it must be accurately formed and the interior surface of the glass tube 53 likewise must be accurately formed. According to one operating device, the tube 53 was 6 millimeters in diameter, the plunger 61 was 0.124 inches in diameter with a tolerance of ±.0005 inches, the plunger had a length of 0.250 inches with a tolerance of ±0.002 inches. The clearance between the plunger and the interior of the glass tube 53 needs to be in the vicinity of 0.001 to 0.002 inches for best results. The plunger, in the operating apparatus had a mass or weight of about 135 to 145 milligrams and the vacuum operating it was in the range of 0.01 to 0.02 pounds per square inch.

The clearance between the plunger and the glass tube must permit the plunger to move up and down easily and at the same time must not permit such leakage of vacuum that the plunger will not move up when it is supposed to.

Figure 8:
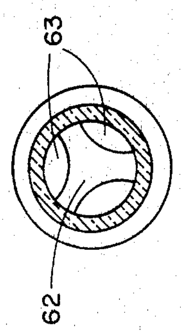
FIG. 8 is a sectional view taken substantially in the direction of the arrows 8—8 of FIG. 7.

As may be seen in FIGS. 7 and 8 there is a spacer 62 at the bottom of the tube 53, the spacer being press fitted into the tube. The spacer 62 is formed with substantial sized cusps or spaces, 63 spaced 120° apart in order to provide openings through which air, as well as vacuum, may pass in the operation of the device. Typically the spacer 63 may be formed of a relatively soft material such as nylon to avoid bouncing of the plunger. Similarly, at the top of the tube 53 there is a nylon spacer 64 spaced the same as the spacer 63, the spacer 64, also, being pressfitted into the tube 53. Press-fitted or held in any other way to the upper and lower ends of the glass tube 53 are nipples 65 and 66 to which the hoses or tubes 43 and 44 may be attached (FIG. 1). The plunger 61 has no tendency to stick in either of its positions because it is a smooth and accurate cylinder working in a smooth glass tube, and the flat surfaces of the spacers do not tend to grip or hold the plunger. The plunger thus responds quickly and readily to the presence or absence of vacuum.

Other dimensions and constants of the tube and cylinder may be used for particular conditions.

The operation of the sensing mechanism illustrated in FIG. 7 may be described as follows: When a die is to be picked up, that is, when the probe 17 is in the lowermost position A, vacuum is applied as will be subsequently explained. The rush of air accompanying the pick up of die 27, carries plunger 61 to the position shown dotted momentarily. However, as the pick up of the die 27 seals the opening through probe 17, the flow of air discontinues and the plunger 61 moves downwardly under the force of gravity to the position shown by solid lines in FIG. 7. The broken line 60 signifies the physical separation of the probe 17 and the hose 44 as seen in FIG. 1. Accordingly, the light from the bulb 54 will continue to be seen by the photocell 55 and the circuit remains in status quo as will be described. The die 27 having been picked up will be carried throughout the remaining motions of the arm 29 to positions B, C and D.

As the probe 17 moves towards position D and in fact is approaching position D as will become clear, sensing contacts 67 are closed, as by a cam 68 (FIGS. 5 and 6) closing the contacts 68 for a purpose to be described. If a die 27 is present and is deposited on the flag or lead 37, the sensing mechanism indicates that a die is present and being deposited, including in part the fact that illumination from bulb 54 is being sensed by photocell 55, and the indexing motor 26 has its energization initiated for moving the lead frame 31 to the next position. If at the point where arm 29 is adjacent position D and the sensing takes place, and no die 27 is being held to the probe 17 (the plunger 61 will be in the upper position), even though contacts 67 are closed, a relay circuit including the coil 69 will become energized to open the normally-closed contacts 71 (dotted line 70, FIGS. 5 and 6) to prevent energization of the circuit for starting the index motor. Hence the index motor will not start, and consequently the lead frame 31 will remain in the same position, thereby enabling the operator to put the apparatus through its cycle again to pick up a die 27 and deposit it upon the same flag 37. This cycle will be repeated until a die is picked up and deposited at the flag 37. In this manner, no lead frames are passed without having dice bonded thereto and the yield of the productivity is increased by several percent. As pointed out, in a high speed die bonding apparatus such an increase is not only worthwhile, but is of great worth.

Figure 5:
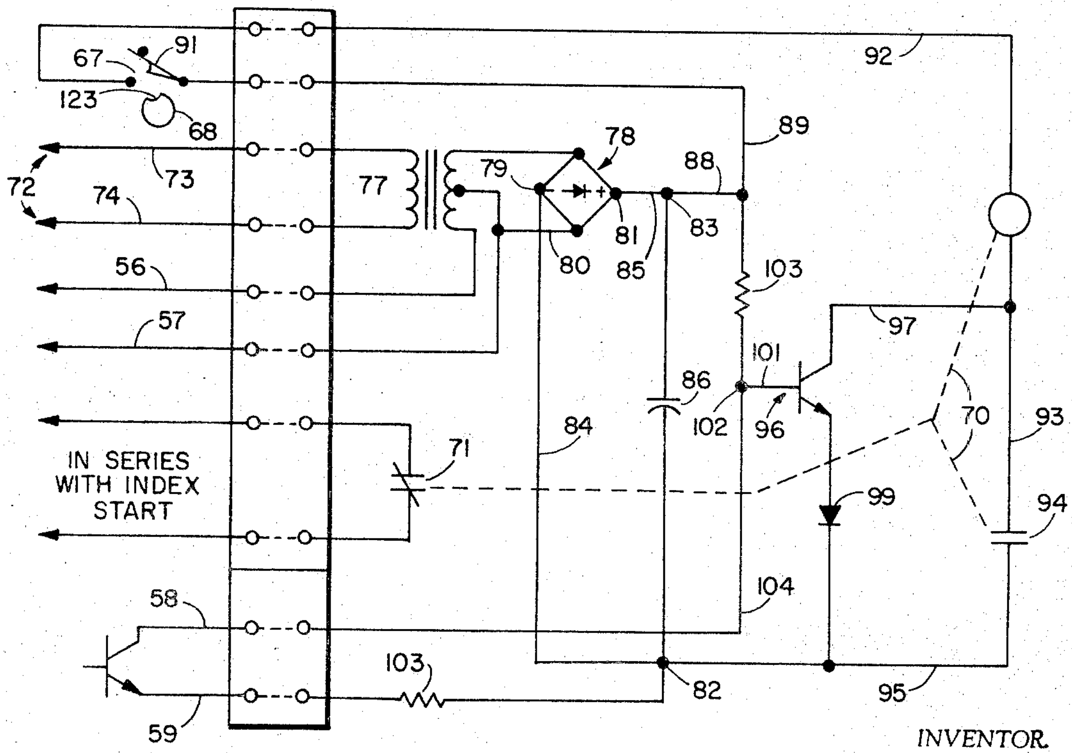
FIG. 5 is a circuit diagram of certain electrical components utilized in connection with the apparatus according to the invention.
Figure 6:
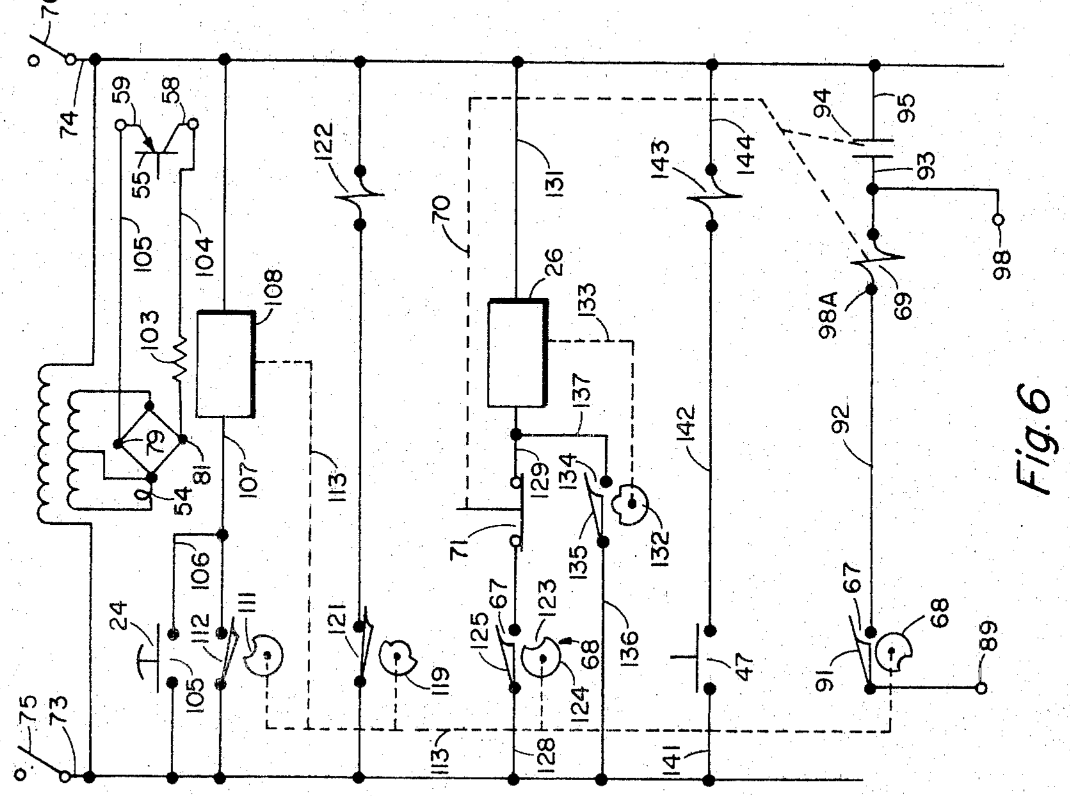
FIG. 6 is a further circuit diagram illustrating operation of certain components of the apparatus according to the invention.

Referring to FIGS. 5 and 6, the operation of the electrical circuit may be visualized by applying a source of voltage 72, for example, 115 volts to conductors 73 and 74 as by closing switches 75 and 76. The transformer 77 is thus energized and supplies a full wave rectifier 78 from whose output terminals 79 and 81 voltage is supplied to the terminals 82 and 83 (FIG. 5) via conductors 84 and 85. A capacitor 86 is connected between terminals 82 and 83 to smooth out the voltage across these terminals. From a tap on the secondary winding of transformer 77, a conductor 80 extends to one input terminal of the rectifier and through conductor 57 to one terminal of lamp 54, and from the end of the secondary winding, a conductor 56 extends to the other terminal of lamp 54. Thus the lamp 54 is energized at all times (FIG. 7) and the phototransistor 55 receives this illumination at all times except when the light is blocked by the plunger 61. From terminal 83 a conductor 88 extends to conductor 89 and thus to the movable arm 91 of a cam operated switch having contacts 67. These contacts, when closed, complete a circuit through conductor 92 to one terminal 98A of the relay coil 69. The other terminal of relay coil 69 extends through conductor 93 through normally open contacts 94 and conductor 95 to to terminal 82.

An NPN transistor 96 has its collector connected through conductor 97 to terminal 98 on conductor 93 and has its emitter connected through a diode 99 to the conductor 95 and thus to terminal 82. The base of transistor 96 is connected through a conductor 101 to a terminal 102 which is connected through a resistor 103 to the conductor 89 and to the conductor 104. Conductor 104 and conductor 105 extending from terminal 82 are connected to the two terminals of a phototransistor 55 through conductors 58 and 59.

In the circuit as described the light 54 is "on" all the time as indicated and the phototransistor 55 is in a low resistance state because thereof. Accordingly the base of transistor 96 is in effect shorted to the emitter through diode 99 and is therefore in a non-conducting state, that is to say, it exhibits a high impedance between terminal 98 and the conductor 95.

Figure 4:
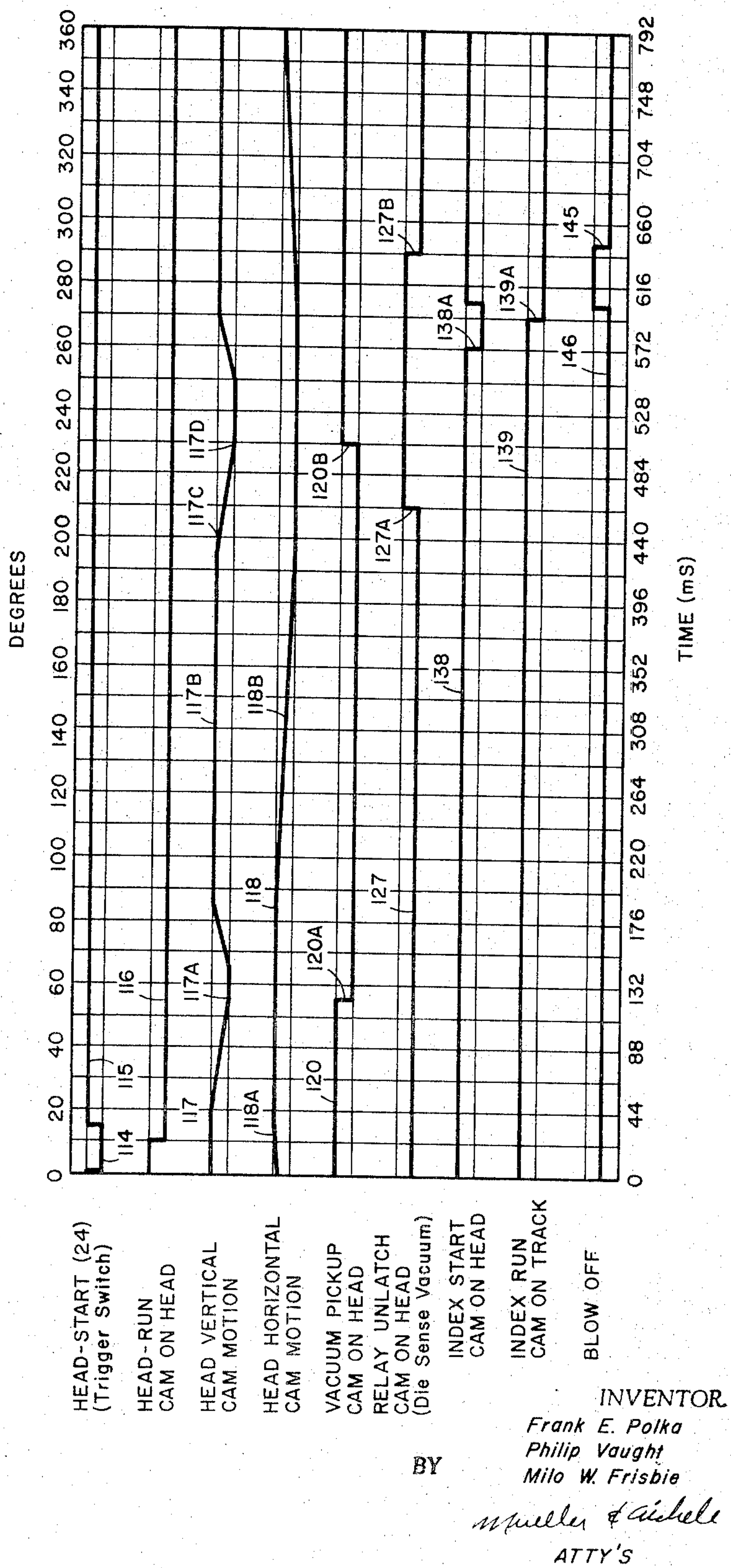
FIG. 4 is a timing chart illustrating the timing of various components of the apparatus utilizing the sensing means according to the invention.

The remaining operation of the device may be considered in connection with the timing diagram of FIG. 4 and the circuit diagrams of FIGS. 5 and 6. The timing diagram illustrates, inter alia, the operational timing of various components including cams as they are correlated with the functioning of the circuits. The timing diagram shows operation both in degrees of cam rotation and elapsed time in milliseconds. Thus to start (Head-Start) the cycle functioning, the operator momentarily closes the thumb switch 24 which closes contacts 105 (FIG. 6). The term Head, as used on FIG. 4 refers to the probe 17 and its associated moving components. Closing contacts 105 completes a circuit from conductor 73 through closed contacts 105, conductor 106, conductor 107, drive motor 108 and conductor 109 to conductor 74, one side of the source of supply. This could occur at or near 0 on FIG. 4. The thumb switch 24, i.e., contacts 105 need be held closed only for about 15° which enables the cam 110 which is driven by motor 108 to move off its low point 111 and close the open contacts 112 thereby completing a lock in circuit, as shown, for motor 108, the contacts 112 remaining closed for the full revolution of cam 110, i.e. until the low point, or depression, 111 enables contacts 112 to open. The mechanical connection between the motor 108 and cam 111 is shown by the dotted line 113. The low point 114 of the graph, Head-Start, FIG. 4, indicates that the trigger, or push button, switch 24 may be closed only for about 15° rotation of the cam 110. For the remainder of the 360° cycle, the contacts 105 may remain open as shown by the continuation of the graph 115. The graph 116, Head Run, cam on head on FIG. 4 illustrates that when the drive motor has started, it continues to run until the cam 110 has its low point 111 rotated about 360° when the arm of the contacts 112 drops into the low point thereby opening the circuit of the drive motor 108. As the motor 108 continues to run, it drives the head including the probe 17 through all of the positions shown in FIG. 3, that is from A to B to C to D and in the reverse until all of the positions have been gone through whereby a die 27 is picked up, carried over and deposited on a flag 37 on lead frame 31.

The graph 117 of FIG. 4, HEAD VERTICAL CAM MOTION shows that at about 20° rotation the head, or probe 17, begins its downward movement until at the point 117A the head is in its lowermost position A. At this point the horizontal motion of the head (HEAD HORIZONTAL CAM MOTION) as shown by portion 118A of the graph 118 has ceased. At this same time the vacuum is turned on by the cam 119, also driven by motor 108, as shown by the dotted line 113. The cam 119 is so disposed that when the probe 17 is on a die 27 in position A, the contacts 121 are closed and a solenoid 122 is actuated thereby opening the solenoid operated vacuum valve 21 to apply vacuum for picking up a die 27. Thus at about 55° when the head or probe 17 is in its lowermost position A, as shown by point 117A of graph 117, the vacuum is turned "on", as shown by the line 120A of graph 120 (VACUUM PICKUP CAM ON HEAD), FIG. 4. If a die is in fact picked up, as already described, the plunger 61 (FIG. 7) moves momentarily upwardly to block the light path between the lamp 54 and the phototransistor 55 and then drops back down to its lowermost position leaving the light pathway intact. Another cam 122 is connected to be driven by the drive motor 108 as shown by the dotted line 113. The cam 122 has a depressed portion 123 and a dwell 124 arranged to cooperate with a movable arm 125 and contacts 126. The vacuum pick up affected by the cam 119 energizing the solenoid 122 is shown by the graph 120 of FIG. 4.

The portion 117B of graph 117 shows the vertical motion of the arm as zero but horizontal movement is continuing as shown by portion 118B of graph 118. At about 195° at point 117C the head, or probe 17, begins to move down until it reaches its lowermost position at 230°, point 117D. Thus as the head reaches its lowermost position, (D) of FIG. 3, the die 27 is deposited on the flag 37 of the lead frame and the vacuum is turned "off" shown by the portion 119A of cam 119 opening the contacts 121 to de-energizing the solenoid 122 thereby releasing the vacuum. The release of the vacuum also is shown by the rising pressure line 120B of graph 120.

Sensing as to whether or not a die 27 is present at the opening of probe 17 occurs at the vertical line 127A, about 210°, of the graph 127. The probe 17 is moving downwardly C to D between portions 117C and 117D of graph 117. At the vertical line 127A of graph 127 the cam 68 is in a position to close the contacts 67 (see also FIG. 5) because of the low point 123 of the cam. If the normally closed contacts 71 (FIGS. 4 and 6) are closed, then a complete circuit exists to the index motor 26 from conductor 73 through conductor 128, contacts 67, contacts 71, conductor 129, motor 26 and conductor 131 to conductor 74. At the sensing point as shown by the line 127A of FIG. 4 the contacts 67 are momentarily closed by cam 68 as shown by the dotted line 113. Closing the contacts 68 energizes the relay coil 69 in the event that energization is supplied to the terminals 98 and 98A. Energization can be supplied to terminals 98 as may be seen in FIG. 5 only if the transistor 96 is in a conducting condition. Transistor 96 is in a conducting position when its base is at a high voltage relative to its emitter which will occur only if the phototransistor 55 is not conducting. The latter condition occurs when the plunger 61 is in its uppermost position.

The plunger 61 is in its uppermost position when there is no die present at the entrance to probe 17 and the vacuum is on, thereby permitting air to rush into the tube 53 through the openings 63 and carry plunger 61 upwardly to block the light path. Thus when transistor 96 is conducting, the relay coil 69 is energized momentarily thereby closing the contacts 94 (dotted line 70) which provides a seal in circuit for the coil 69, and it effects opening and holding open of the contacts 71 thereby preventing the index motor 26 from being energized through the circuit previously described and the index motor remains stationery. This is the condition when no die has been transported from the wafer 16 to the flag 37 on lead frame 31. In the event that a die is present at the entrance to the probe, the just described circuit for energization of coil 69 is not energized. That is, contacts 71 remain closed and the index motor 26 begins to run, therefore moving the lead frame to the next position.

A slight movement of the index motor 26 rotates a cam 132, as shown by the dotted line 133, thereby closing the contacts 134 by permitting the switch arm 135 to drop downwardly. The latter completes a circuit from conductor 73 through conductor 136, switch arm 135, closed contacts 134, conductor 137 to the index motor and through conductor 131 to supply conductor 74.

Referring to FIG. 4 a vertical line 127B at about 290° of graph 127 illustrates when the cam 68 opens the contacts 67 to de-energize the coil 69, if in fact it has been energized.

Graph 138 illustrates the operation of the INDEX START in the event that the index motor 26 does start and illustrates the operation of the cam 132 already described.

The dip 138A of graph 138 illustrates the period of time, approximately 15°, when the cam 68 maintains the contacts 67 closed. Graph 139 illustrates, at line 139A at about 270°, part way between the extremes of the dip 138A that the cam 132 operated by the index motor 26 functions to keep the index motor 26 going until it has completed its cycle which is to move the lead frame one index position.

Referring again to FIG. 6, the contacts 47, also shown on FIG. 3 are shown. In FIG. 6 the contacts 47 extend between supply conductor 75, conductor 141, contacts 47, conductor 142 and a solenoid 143 for controlling the air blow out valve 22 (FIG. 1). As the arm 29 and arm 45 (FIG. 3) move forwardly, it momentarily closes the contacts 47 through the linkage 46 as shown by the rising portion 145 of graph 146 on the timing chart of FIG. 4. For the momentary interval between about 273° and 293° there is an air blast through the valve 22, pipe 51, pipe 43 and pipe 44, and through the probe 17 as described.

The cycle as described has now been completed and can be repeated by the operator depressing the push button switch 24.

What is claimed is:

1. In a semiconductor die-bonding apparatus wherein a die is picked up from a wafer of dice by a vacuum-energized probe, and transferred to a position adjacent a lead member to which the die is to be bonded and at which point it is intended that the die be deposited for bonding and the vacuum released, and indexing start means are provided for energizing an indexing motor to move the lead member containing the deposited and bonded dice to a subsequent position;

- means for preventing the indexing of said start means comprising means for sensing the presence of a dice on said probe; and
- photoelectric means responsive to the die presence condition on said probe for controlling the energization of said indexing start means.

2. The semiconductor die-bonding apparatus according to claim 1 wherein the means responsive to the die presence condition on said probe for controlling the energization of said indexing start means comprises relay means responsive to the condition of the photoelectric means for controlling the circuit of the indexing start means.

3. The semiconductor die-bonding apparatus according to claim 1 wherein the light of the photoelectric means is controlled by vacuum operated means.

4. The semiconductor die-bonding apparatus according to claim 3 wherein the vacuum operated means is a plunger movable in response to the presence of a vacuum.

5. The semiconductor die-bonding apparatus according to claim 4 wherein the plunger, when activated by the presence of a vacuum, blocks the passage of light and the indexing start means is prevented from becoming energized.

6. The semiconductor die-bonding apparatus according to claim 5 wherein the plunger, when inactivated by the lack of a vacuum, permits the passage of light and the indexing start means is enabled to become energized.

7. In a semiconductor die-bonding apparatus wherein a die is picked up from a wafer of dice by a vacuum energized probe, and transferred to a position adjacent a lead member to which the die is to be bonded, and at which point it is intended that the die be deposited for bonding and the vacuum released, and indexing start means are provided for energizing an indexing motor to move a lead member containing the deposited and bonded dice to a subsequent position;

- means for preventing the indexing of said start means said start means comprising a vacuum line adapted to be connected to said probe at one end and to a vacuum source at the other end;
- valve means in said vacuum line for controlling the application of vacuum to and the removal of vacuum from said probe;
- said valve means comprising a vertically disposed clear tube and an opaque plunger freely movable in said tube;
- said plunger being adapted to move upwardly under the influence of applied vacuum and being adapted to move downwardly under the influence of gravity when said vacuum is released;
- means for applying vacuum to said vacuum line when said probe is about to pick up a die and if a die is picked up, said probe end is blocked whereupon said plunger moves to and remains in its downward position;
- photoelectric means including a light source on one side of said clear tube adjacent the upper end thereof and a light sensitive device on the other side of said clear tube adjacent the upper end thereof and being adapted to receive the light from said light source;
- means for sensing for the presence of a die at the end of said probe when said probe is in the stage of depositing a die on a lead member comprising a control circuit;
- switch means adapted be closed in response to the position of said probe for effecting energization of said control circuit; and
- said control circuit functioning when no die is at said probe and said plunger is at the top of said clear tube blocking the transmission of light to prevent energization of said index start means and functioning when a die is at said probe and said plunger is at the bottom of said clear tube permitting the transmission of light to effect energization of said index start means.

8. The semiconductor die-bonding apparatus according to claim 7 wherein said control circuit comprises a transistor whose state of conduction is determined by the light receiving condition of said light sensitive means.

9. The control circuit according to claim 8 wherein the conduction state of said transistor is controlled by the energization of the base of said transistor determined by the light receiving condition of said light sensitive means.

* * * * *